(12) United States Patent
Kim et al.

(10) Patent No.: US 10,916,187 B2
(45) Date of Patent: Feb. 9, 2021

(54) DISPLAY APPARATUS

(71) Applicant: Samsung Display Co., Ltd., Yongin-si (KR)

(72) Inventors: Taehoon Kim, Yongin (KR); Jisu Na, Yongin (KR); Seungkyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 674 days.

(21) Appl. No.: 14/863,165

(22) Filed: Sep. 23, 2015

(65) Prior Publication Data

US 2016/0240135 A1 Aug. 18, 2016

(30) Foreign Application Priority Data

Feb. 13, 2015 (KR) .................. 10-2015-0022719

(51) Int. Cl.
*G09G 3/3225* (2016.01)
*H01L 27/32* (2006.01)

(52) U.S. Cl.
CPC ..... *G09G 3/3225* (2013.01); *G09G 2300/043* (2013.01); *G09G 2300/0426* (2013.01); *G09G 2310/0281* (2013.01); *H01L 27/3279* (2013.01)

(58) Field of Classification Search
CPC ......... G09G 3/3225; G09G 2300/0426; G09G 2310/0281; G09G 2300/043; H01L 27/3279

See application file for complete search history.

(56) References Cited

U.S. PATENT DOCUMENTS

| | | | |
|---|---|---|---|
| 8,587,576 B2 | 11/2013 | Park et al. | |
| 9,514,673 B2 | 12/2016 | Kwon et al. | |
| 9,646,559 B2 | 5/2017 | Min et al. | |
| 2003/0184703 A1 | 10/2003 | Greene et al. | |
| 2010/0134743 A1* | 6/2010 | Shin .................. | G02F 1/13 349/143 |

(Continued)

FOREIGN PATENT DOCUMENTS

| | | |
|---|---|---|
| CN | 102044215 | 5/2011 |
| CN | 103578443 | 2/2014 |
| CN | 103839516 | 6/2014 |

(Continued)

*Primary Examiner* — William Boddie
*Assistant Examiner* — Saifeldin E Elnafia
(74) *Attorney, Agent, or Firm* — H.C. Park & Associates, PLC

(57) ABSTRACT

A display apparatus in which data signal distortion is reduced and thus is capable of accurately displaying an image includes a substrate including a display area that includes a first display area and a second display area, and a peripheral area surrounding the display area, first and second data lines respectively across the first and second display areas, main scan lines across the display area and disposed in parallel to the first and second data lines, sub scan lines across the display area and respectively connected to the main scan lines, the sub scan lines being disposed to cross the main scan lines, first data line pads connected to the first data lines, second data line pads connected to the second data lines, and scan line pads connected to the main scan lines, the first data line pads, the scan line pads, and the second data line pads being adjacent.

16 Claims, 4 Drawing Sheets

(56) References Cited

U.S. PATENT DOCUMENTS

2010/0171687 A1* 7/2010 Chiang ................ G09G 3/3648
                                                   345/98
2012/0127412 A1* 5/2012 Lee ....................... G02F 1/1345
                                                   349/139

FOREIGN PATENT DOCUMENTS

| JP | 2009-069768 A | 4/2009 |
|----|---------------|--------|
| KR | 10-0599470 B1 | 4/2006 |
| KR | 10-2006-0128271 A | 12/2006 |
| KR | 10-2007-0019460 A | 2/2007 |
| KR | 10-2008-0009797 A | 1/2008 |

* cited by examiner

DISPLAY APPARATUS

CLAIM OF PRIORITY

This application claims the priority of and all the benefits accruing under 35 U.S.C. § 119 of Korean Patent Application No. 10-2015-0022719, filed on Feb. 13, 2015, in the Korean Intellectual Property Office (KIPO), the disclosure of which is incorporated herein in its entirety by reference.

BACKGROUND OF THE INVENTION

1. Field of Disclosure

One or more exemplary embodiments relate to a display apparatus, and more particularly, to a display apparatus in which data signal distortion is reduced and thus is capable of accurately displaying images.

2. Description of the Related Art

In an organic light-emitting display apparatus, thin film transistors (TFTs) are generally disposed in each (sub) pixel to adjust brightness of each (sub) pixel. The TFTs adjust brightness of each (sub) pixel according to received data signals.

However, in a display apparatus of the related art, data signals may be distorted while being transmitted to a (sub) pixel, and thus, the actual brightness of a (sub) pixel may be different from an intended brightness. In this case, an image may be displayed on the display apparatus differently than intended, that is, the displayed image may be a low-quality image.

SUMMARY OF THE INVENTION

One or more exemplary embodiments include a display apparatus in which data signal distortion is reduced and thus is capable of accurately displaying images.

Additional aspects will be set forth in part in the description which follows and, in part, will be apparent from the description, or may be learned by practice of the presented exemplary embodiments.

According to one or more exemplary embodiments, a display apparatus includes a substrate comprising a display area comprising a first display area and a second display area, and a peripheral area surrounding the display area; a plurality of first data lines disposed across the first display area in parallel to one another; a plurality of second data lines parallel to one another across the second display area and disposed in parallel to the plurality of first data lines; a plurality of main scan lines parallel to one another across the display area and disposed in parallel to the first and second data lines; a plurality of sub scan lines parallel to one another across the display area and respectively electrically connected to the plurality of main scan lines, wherein the plurality of sub scan lines disposed to cross the plurality of main scan lines; a plurality of first data line pads electrically connected to the plurality of first data lines and located at a side of the plurality of first data lines; a plurality of second data line pads electrically connected to the plurality of second data lines and located at a side of the plurality of second data lines; and a plurality of scan line pads electrically connected to the plurality of main scan lines and located at a side of the plurality of main scan lines, wherein the plurality of first data line pads and the plurality of scan line pads are adjacent to each other, and the plurality of scan line pads and the plurality of second data line pads are adjacent to each other.

The plurality of first data line pads, the plurality of scan line pads, and the plurality of second data line pads may be sequentially disposed.

The plurality of scan line pads are located between the plurality of first data line pads and the plurality of second data line pads.

The display apparatus may further include a scan driver circuit disposed between the plurality of main scan lines and the plurality of scan line pads. The plurality of main scan lines and the plurality of scan line pads may be electrically connected to the scan driver circuit.

The plurality of main scan lines may include a plurality of first main scan lines parallel to one another across the first display area; and a plurality of second main scan lines parallel to one another across the second display area.

The scan driver circuit may include a first scan driver circuit electrically connected to the plurality of first main scan lines, and a second scan driver circuit electrically connected to the plurality of second main scan lines.

The plurality of scan line pads may include a plurality of first scan line pads electrically connected to the first scan driver circuit, and a plurality of second scan line pads electrically connected to the second scan driver circuit.

The plurality of first scan line pads may be disposed between the plurality of first data line pads and the plurality of second scan line pads, and the plurality of second scan line pads may be disposed between the plurality of first scan line pads and the plurality of second data line pads.

The display area may not have a pointed portion.

The display area may be circular or oval shaped.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
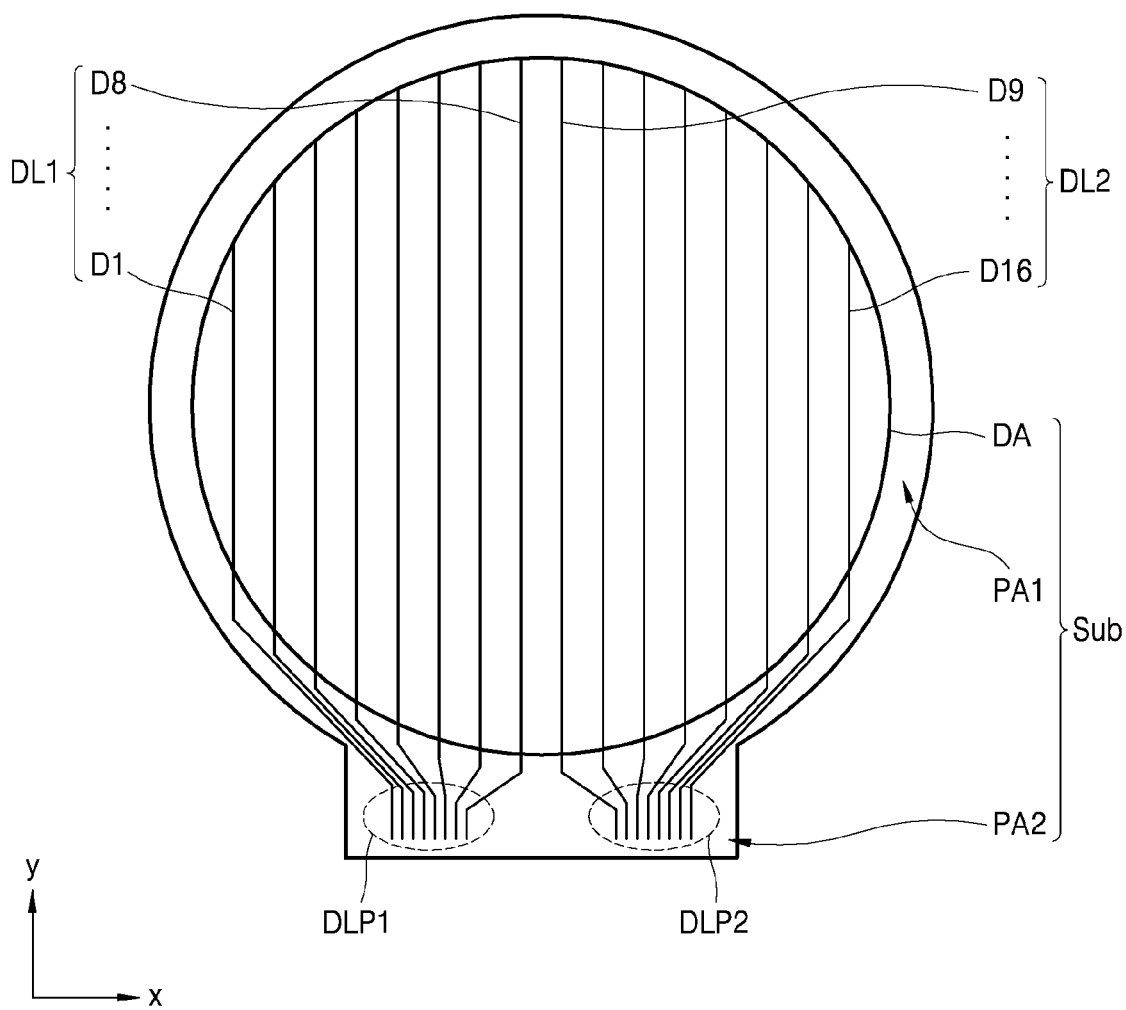
FIG. 1 is a conceptual view schematically illustrating a portion of a display apparatus according to an exemplary embodiment.

As the inventive concept allows for various changes and numerous embodiments, particular embodiments will be illustrated in the drawings and described in detail in the written description. The effect and features of the inventive concept and the method of realizing the effect and the features will be clear with reference to the exemplary embodiments described in detail below with reference to the drawings. However, the inventive concept may be embodied in various forms and should not be construed as being limited to the exemplary embodiments. As used herein, the term "and/or" includes any and all combinations of one or more of the associated listed items. Expressions such as "at least one of," when preceding a list of elements, modify the entire list of elements and do not modify the individual elements of the list.

The exemplary embodiments of the present inventive concept will be described in detail with reference to the accompanying drawings. Like reference numerals in the drawings denote like elements, and thus their description will not be repeated.

It will be understood that when a layer, region, or component is referred to as being "formed on" another layer, region, or component, it can be directly or indirectly formed on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
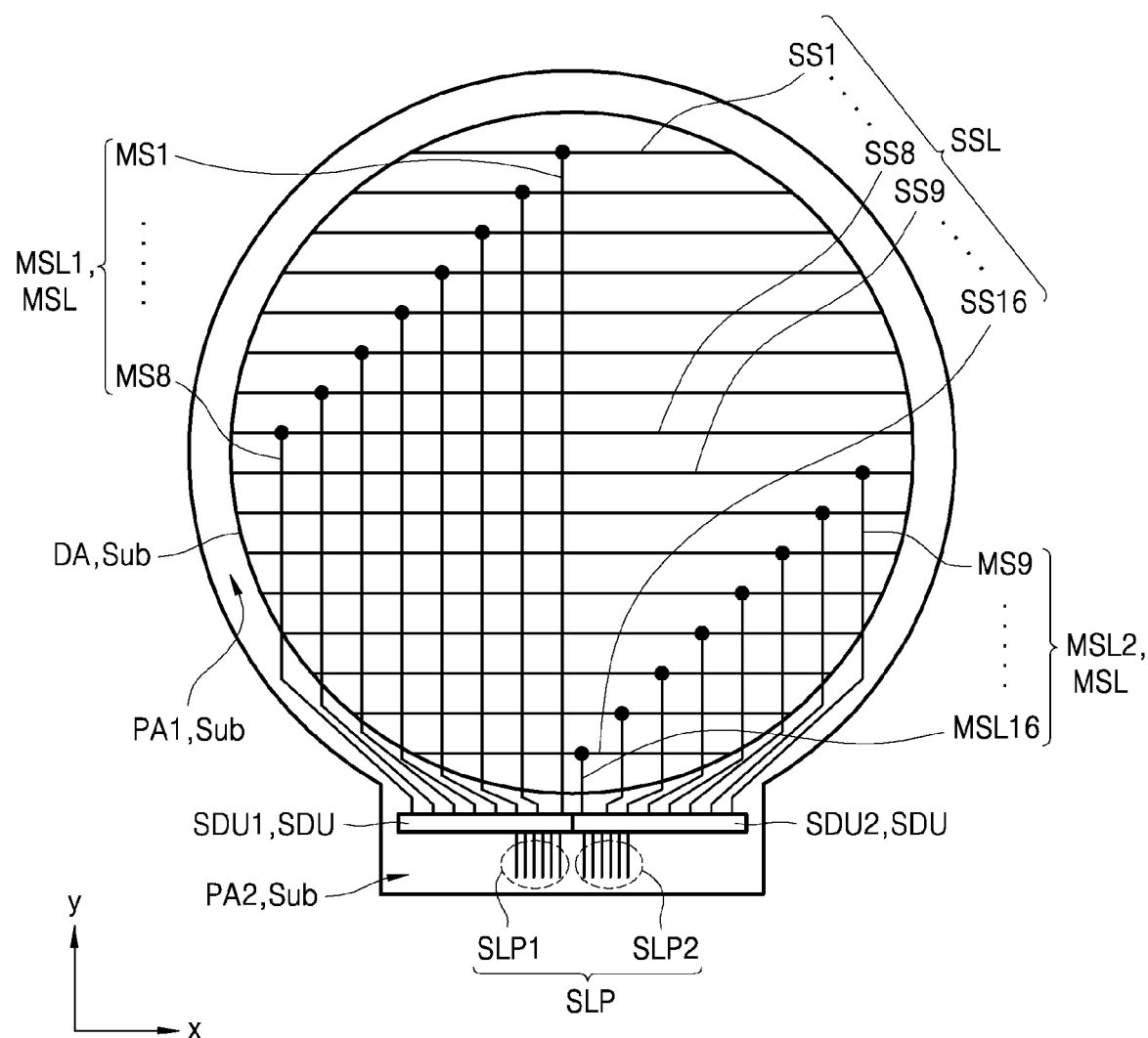
FIG. 2 is a conceptual view schematically illustrating a portion of the display apparatus of FIG. 1.

FIG. 1 is a conceptual view schematically illustrating a portion of a display apparatus according to an exemplary embodiment. FIG. 2 is a conceptual view schematically illustrating a portion of the display apparatus of FIG. 1. The display apparatus according to the present exemplary embodiment includes a plurality of first data lines DL1, a plurality of second data lines DL2, a plurality of main scan lines MSL, a plurality of sub scan lines SSL, a plurality of first data line pads DLP1, a plurality of second data line pads DLP2, and a plurality of scan line pads SLP, which are disposed on a substrate Sub.

The substrate Sub may be formed by using various materials such as a glass material, a metallic material, or a plastic material. The substrate Sub includes a display area DA and a first peripheral area PA1 that surrounds the display area DA. In FIGS. 1 and 2, the display area DA is circular shaped and the first peripheral area PA1 is ring shaped and surrounds the display area DA. As illustrated in FIGS. 1 and 2, other than the first peripheral area PA1, the substrate Sub may include a second peripheral area PA2 that protrudes from a portion of the first peripheral area PA1. The display area DA may include a first display area DA1 and a second display area DA2. For example, as shown in FIGS. 1 and 2, each of the first and second display areas DA1 and DA2 may be half-circle shaped, and respective portions of the first and second display areas DA1 and DA2 which contact each other may cross the center of the display area DA and extend in a y-axis direction.

The first data lines DL1 may extend in the y-axis direction and be disposed in parallel to one another across the first display area DA1. For convenience of description, in FIG. 1, eight first data lines D1 to D8 are disposed across the first display area DA1. When the display area DA is circular shaped, the first data lines D1 to D8 may have different lengths as shown in FIG. 1. The second data lines DL2 may also extend in the y-axis direction and be disposed in parallel to one another across the second display area DA2. As in the same manner as the first data lines D1 to D8, in FIG. 1, eight second data lines D9 to D16 are disposed across the second display area DA2. Since the display area DA is circular shaped, the second data lines D9 to D16 may have different lengths as shown in FIG. 1. The second data lines D9 to D16 are parallel to the first data lines D1 to D8.

Referring to FIG. 2, the main scan lines MSL are disposed in parallel across the display area DA, and the main scan lines MSL disposed in parallel to the first data lines DL1 and the second data lines DL2. In FIG. 2, sixteen main scan lines MS1 to MS16 extend in the y-axis direction. The main scan lines MS1 to MS16 may have different lengths, or some may have the same length (not shown). When disposing the main scan lines MSL across the display area DA, it is sufficient if the main scan lines MSL cross at least a portion of the display area DA, and it is not necessary for each of the main scan lines MSL to cross the entirety of the display area DA.

The main scan lines MSL may include a plurality of first main scan lines MSL1 and a plurality of second main scan lines MSL2. In this case, same as the first data lines DL1, the first main scan lines MSL1 may be disposed in parallel to one another across first display area DA1, and as the second data lines DL2, the second main scan lines MSL2 may be disposed in parallel to one another across the second display area DA2. In FIG. 2, eight main scan lines MS1 to MS8 on the left side are the first main scan lines MSL1, and eight main scan lines MS9 to MS16 on the right side are the second main scan lines MSL2.

The main scan lines MSL do not directly contact the first data lines DL1 or the second data lines DL2. In the case that the main scan lines MSL are disposed on the same plane as the first data lines DL1 and the second data lines DL2, they may be alternately disposed such that they do not directly contact one another. Alternatively, if necessary, the main scan lines MSL may be disposed at a level different from that of the first data lines DL1 and the second data lines DL2.

The sub scan lines SSL are disposed in parallel to one another across the display area DA. The sub scan lines SSL are disposed such that they intersect the main scan lines MSL. In FIG. 2, the sub scan lines SSL extend in an x-axis direction and intersect the main scan lines MSL that extend in the y-axis direction. The sub scan lines SSL may respectively electrically connected to the main scan lines MSL. In FIG. 2, the sixteen sub scan lines SS1 to SS16 respectively electrically connected to the sixteen main scan lines MS1 to MS16.

The sub scan lines SSL may be disposed at a level different from the main scan lines MSL. That is, an insulating layer may be disposed between the sub scan lines SSL and the main scan lines MSL. Also, the sub scan lines SSL may be electrically connected to the main scan lines MSL via contact holes formed in the insulating layer. In FIG. 2, the sub scan lines SSL are electrically connected to the main scan lines MSL via contact holes, which are indicated by black dots. That is, the main scan line MS1 is electrically connected to the sub scan line SS1, the main scan line MS2 is electrically connected to the sub scan line SS2, and likewise, the main scan line MS16 is electrically connected to the sub scan line SS16.

Figure 3:
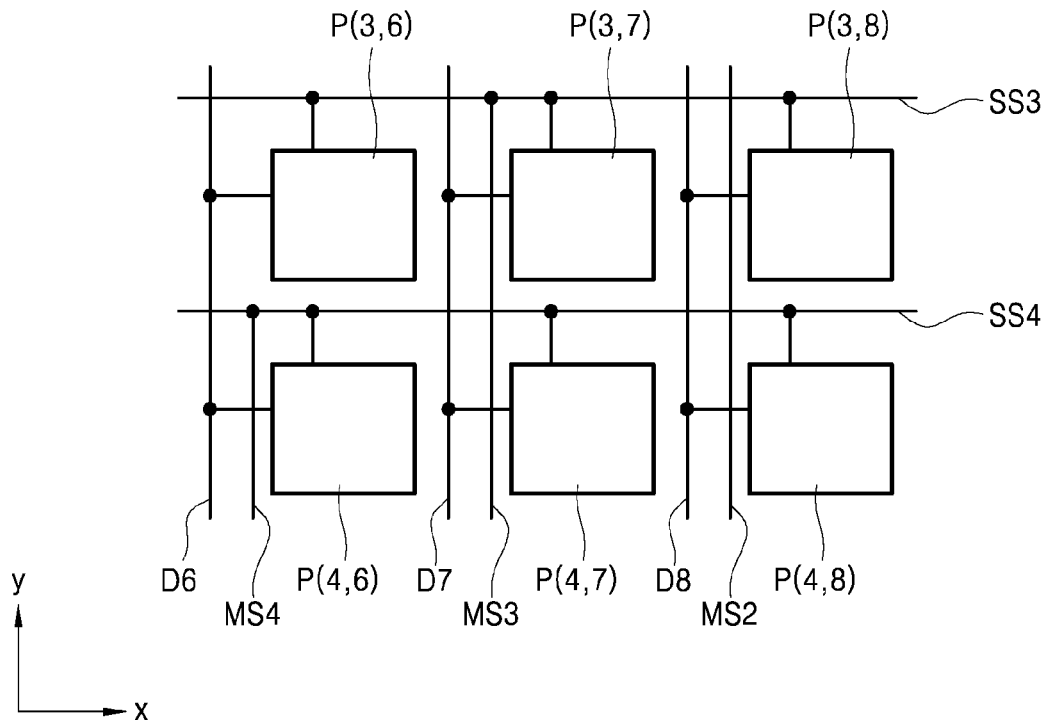
FIG. 3 is a conceptual view schematically illustrating a portion of the display apparatus of FIG. 1.

Intersections between the first and second data lines DL1 and DL2 and the sub scan lines SSL may define (sub) pixels. Hereinafter, a sub-pixel and a pixel are both referred to as a "pixel". FIG. 3 is a conceptual view schematically illustrating a portion of the display apparatus of FIG. 1, i.e., pixel areas. As shown in FIG. 3, a pixel P(3,6) is located at an intersection of the sub scan line SS3 and the data line D6, a pixel P(3,7) is located at an intersection between the sub scan line SS3 and the data line D7, and a pixel P(3,8) is located at an intersection between the sub scan line SS3 and the data line D8. Likewise, a pixel P(4,6) is located at an intersection between the sub scan line SS4 and the data line D6, a pixel P(4,7) is located at an intersection between the sub scan line SS4 and the data line D7, and a pixel P(4,8) is located at an intersection between the sub scan line SS4 and the data line D8.

Each of the pixels P(3,6), P(3,7), P(3,8), P(4,6), P(4,7), and P(4,8) may include a thin film transistor (TFT) (not shown) or a capacitor (not shown), and a display device (not shown). The display device may include, for example, an organic light-emitting device (OLED). Various methods may be used to control the amount of light emitted by the pixels P(3,6), P(3,7), P(3,8), P(4,6), P(4,7), and P(4,8). For example, by applying a scan signal to the main scan line MS3, the scan signal is transmitted to the sub scan line SS3 that is electrically connected to the main scan line MS3, and thus, the pixels P(3,6), P(3,7), and P(3,8) connected to the sub scan line SS3 may be selected. In such state, when a data signal, which is related to a brightness of light to be emitted by the pixels P(3,6), P(3,7), and P(3,8), is applied to the data lines D6 to D8, the brightness of light emitted by the pixels P(3,6), P(3,7), and P(3,8) may be determined according to the applied data signal. Next, a scan signal may be applied to the main scan line MS4, and as the scan signal is transmitted to the sub scan line SS4 electrically connected to the main scan line MS4, the pixels P(4,6), P(4,7), and P(4,8) connected to the sub scan line SS4 may be selected. In such state, when a data signal, which is related to a brightness of light to be emitted by the pixels P(4,6), P(4,7), and P(4,8), is applied to the data lines D6 to D8, the brightness of light emitted by the pixels P(4,6), P(4,7), and P(4,8) may be determined according to the applied data signal.

The first data line pads DLP1 may be located in the second peripheral area PA2 of the substrate Sub instead of the display area DA of the substrate Sub so that the data signal may be applied to the first data lines DL1, as shown in FIG. 1. The first data line pads DLP1 may be located at a side (−y direction) of the first data lines DL1 so that the first data line pads DLP1 may be electrically connected to the first data lines DL1. Likewise, the second data line pads DLP2 may be located in the second peripheral area PA2 of the substrate Sub instead of the display area DA of the substrate Sub so that the data signal may be applied to the second data lines DL2, as shown in FIG. 1. The second data line pads DLP2 may be located at a side (−y direction) of the second data lines DL2 so that the second data line pads DLP2 may be electrically connected to the second data lines DL2.

The first data line pads DLP1 may refer only to elements located in the second peripheral area PA2 (which extend in the y-axis direction), as shown in FIG. 1. In this case, the first data line pads DLP1 and the first data lines DL1 may be connected via connection wiring. The connection wiring may be located at the same level as the first data line pads DLP1 and the first data lines DL1, or at a different level from the first data line pads DLP1 and the first data lines DL1 and electrically connected to the first data line pads DLP1 and the first data lines DL1 via contact holes.

The second data line pads DLP2 may also refer only to elements located in the second peripheral area PA2 (which extend in the y-axis direction), as shown in FIG. 1. In this case, the second peripheral area PA2 and the second data lines DL2 may be connected via connection wiring. The connection wiring may be located at the same level as the second data line pads DLP2 and the second data lines DL2, or located at a different level from the second data line pads DLP2 and the second data lines DL2 and electrically connect to the second data line pads DLP2 and the second data lines DL2 via contact holes.

Figure 4:
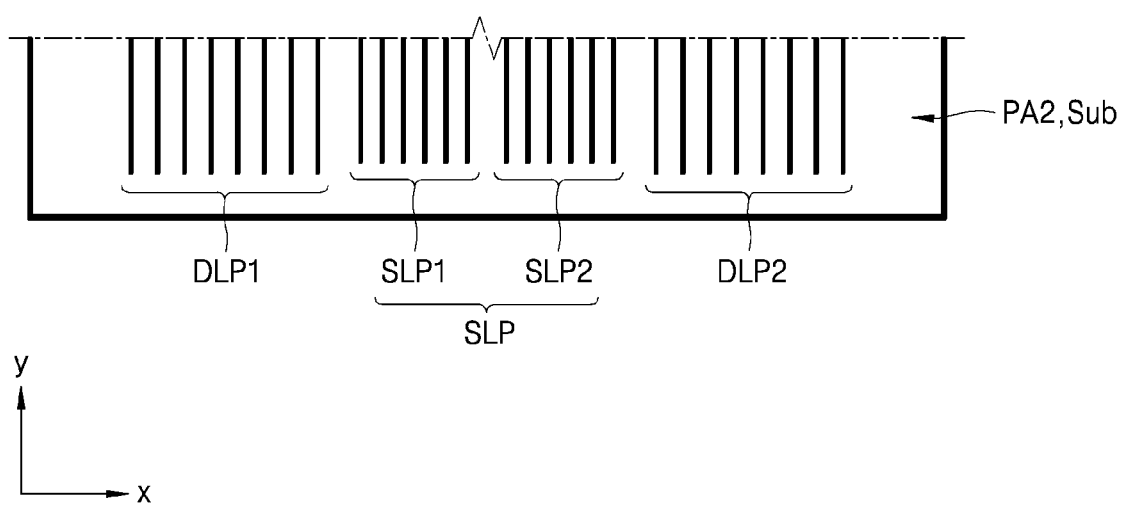
FIG. 4 is a conceptual view schematically illustrating a portion of the display apparatus of FIG. 1.

Similarly, the scan line pads SLP may be located at the second peripheral area PA2 of the substrate Sub instead of the display area DA of the substrate Sub so that the scan signal may be applied to the main scan lines MSL, as shown in FIG. 2. The scan line pads SLP may be disposed at a side (−y direction) of the main scan lines MSL so that the scan line pads SLP may be electrically connected to the main scan lines MSL. The scan line pads SLP may be disposed between the first and second data line pads DLP1 and DLP2, as shown in FIG. 4 that is a conceptual view schematically illustrating a portion of the display apparatus of FIG. 1.

The first data line pads DLP1 and the scan line pads SLP may be adjacent to each other, and the scan line pads SLP and the second data line pads DLP2 may be adjacent to each other. That is, the first data line pads DLP1, the scan line pads SLP, and the second data line pads DLP2 may be alternately disposed.

The scan line pads SLP may include a plurality of first scan line pads SLP1 and a plurality of second scan line pads SLP2. In this case, the first scan line pads SLP1 may be disposed between the first data line pads DLP1 and the second scan line pads SLP2, and the second scan line pads SLP2 may be disposed between the first scan line pads SLP1 and the second data line pads DLP2.

The scan line pads SLP may be referring to only elements located in the second peripheral area PA2 (which extend in the y-axis direction), as shown in FIG. 2. In this case, the scan line pads SLP and the main scan lines MSL may be connected via connection wiring. The connection wiring may be located at the same level as the scan line pads SLP and the main scan lines MSL, or at a different level from the scan line pads SLP and the main scan lines MSL and electrically connected to the scan line pads SLP and the main scan lines MSL via contact holes.

A scan driver circuit SDU may be disposed between the main scan lines MSL and the scan line pads SLP. Therefore, the main scan lines MSL and the scan line pads SLP may be electrically connected to the scan driver circuit SDU. The scan driver circuit SDU includes, for example, a shift register, and may also include TFTs that are simultaneously formed when forming TFTs that are included in pixels in the display area DA.

The scan driver circuit SDU may operate in various ways according to a method of driving the display apparatus. For example, scan signals may be sequentially applied to the main scan line MS1 to the main scan line MS16 so that the scan signals may be sequentially applied to the sub scan line SS1 to the sub scan line SS16. Accordingly, pixels electrically connected to the sub scan line SS1 may be selected, pixels electrically connected to the sub scan line SS2, sequentially, until pixels electrically connected to the sub scan line SS16 are selected. In this case, the scan line pads SLP may be components to which high signals, low signals, and/or clock signals, which are required by TFTs in the scan driver circuit SDU, are applied.

The scan driver circuit SDU may be configured in various ways. For example, as shown in FIG. 2, the scan driver circuit SDU may include a first scan driver circuit SDU1 electrically connected to the first main scan lines MSL1, and a second scan driver circuit SDU2 electrically connected to the second main scan lines MSL2. In this case, the first scan line pads SLP1 may be electrically connected to the first scan driver circuit SDU1, and the second scan line pads SLP2 may be electrically connected to the second scan driver circuit SDU2.

An integrated circuit (IC) or a printed circuit board (PCB), to which the IC is attached, may be attached to the first data line pads DLP1, the second data line pads DLP2, and the scan line pads SLP. Accordingly, an electric signal that passes through the IC may be input to the first data line pads DLP1, the second data line pads DLP2, and the scan line pads SLP, and thus, an image is displayed in the display area DA.

In the display apparatus according to the present exemplary embodiment display apparatus, the scan line pads SLP may be disposed between the first data line pads DLP1 and the second data line pads DLP2, as shown in FIG. 4. Therefore, it is possible to prevent or reduce distortion of data signals during a process of transmitting the data signals to the pixels.

Figure 5:
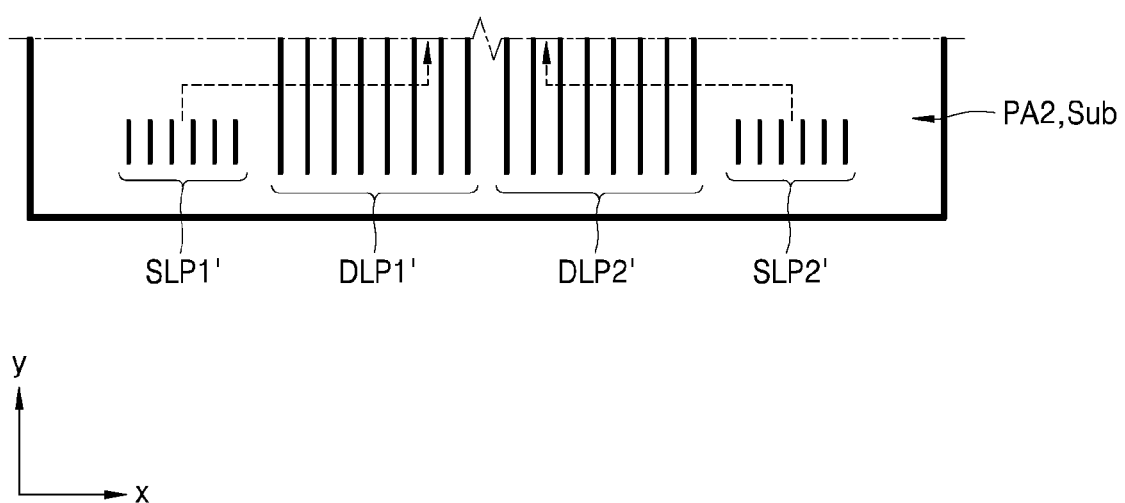
FIG. 5 is a conceptual view schematically illustrating a portion of a display apparatus according to a comparative embodiment.

For example, FIG. 5 schematically illustrates a portion of a display apparatus according to a comparative embodiment. When a plurality of first data line pads DLP1' and a plurality of second data line pads DLP2' are located between a plurality of first scan line pads SLP1' and a plurality of second scan line pads SLP2', as indicated with dashed lines, the first scan line pads SLP1' are disposed across the first data line pads DLP1' (at a different level) and electrically connected to a scan driver circuit, and the second scan line pads SLP2' are disposed across the second data line pads DLP2' (at a different level) and electrically connected to the scan driver circuit. In this case, when a data signal for controlling brightness of pixels are transmitted to a plurality of data lines via the first data line pads DLP1' and the second data line pads DLP2', the data signal may be distorted during the transmission process, and a brightness of a pixel may be different from a first intended brightness. Also, parasitic capacitance may exit at an overlapping portion.

In other words, the data signals that pass through the first and second data line pads DLP1' and DLP2' may be affected by high signals, low signals, and/or clock signals that are input to the first and second scan line pads SLP1' and SLP2', cross over the first and second data line pads DLP1' and DLP2', and transmitted to the scan driver circuit. As a result, an image may not be accurately displayed in a display area DA.

However, in the display apparatus according to the present exemplary embodiment, the scan line pads SLP may be disposed between the first and second data line pads DLP1 and DLP2, as shown in FIG. 4. Accordingly, the high signals, the low signals, and/or the clock signals input to the scan line pads SLP may be prevented from crossing over outer sides of the first and second data line pads DLP1 and DLP2 or cross only a small area of the outer sides of the first and second data line pads DLP1, and then be transmitted to the scan driver circuit SDU. Therefore, the data signals that pass through the first and second data line pads DLP1 and DLP2 may be not affected at all or only affected to a small extent by the signals input to the scan line pads SLP, and thus an image may be accurately displayed in the display area DA.

If the display area DA is quadrilateral shaped, the scan driver circuit SDU may not be disposed near the first data line pads DLP1 or the second data line pads DLP2 as shown in FIG. 2. The first data line pads DLP1 or the second data line pads DLP2 may be disposed at an edge of the display area DA that is quadrilateral shaped, and a scan driver circuit may be disposed at another edge of the display area DA. In this case, the scan line pads SLP may be disposed near the scan driver circuit so that an electrical path between the scan line pads SLP and the scan driver circuit does not cross over the first data line pads DLP1 or the second data line pads DLP2.

However, as shown in FIGS. 1 and 2, if the display area DA does not have a pointed portion, for example, if the display area DA circular or oval shaped, the substrate Sub, which is related to an overall shape of the display apparatus, may also be circular or oval shaped. In this case, since the scan line pads SLP have to be near the first data line pads DLP1 or the second data line pads DLP2, as described above, the scan line pads SLP may be located between the first and second data line pads DLP1 and DLP2 so that the data signals are not distorted or are distorted by only a small extent.

As described above, according to the one or more of the above exemplary embodiments, a display apparatus in which data signal distortion is reduced and thus is capable of accurately displaying images is provided.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
    a substrate comprising a display area comprising a first display area and a second display area, and a peripheral area surrounding the display area;
    a plurality of first data lines disposed across the first display area in parallel to one another;
    a plurality of second data lines parallel to one another across the second display area and disposed in parallel to the plurality of first data lines;
    a plurality of main scan lines parallel to one another across the display area and disposed in parallel to the first and second data lines;
    a plurality of sub scan lines parallel to one another across the display area and respectively electrically connected to the plurality of main scan lines, wherein the plurality of sub scan lines disposed to cross the plurality of main scan lines;
    a plurality of first data line pads electrically connected to the plurality of first data lines and located at a side of the plurality of first data lines;
    a plurality of second data line pads electrically connected to the plurality of second data lines and located at a side of the plurality of second data lines; and
    a plurality of scan line pads electrically connected to the plurality of main scan lines and located at a side of the plurality of main scan lines,
    wherein:
    the substrate is divided into a first side and a second side with respect to a reference axis passing through a center of the display area;
    the plurality of first data line pads, the plurality of scan line pads, and the plurality of second data line pads are located in the first side; and
    a single group, which includes all of the plurality of scan line pads on the substrate that are adjacent to each other, is disposed in an area between a first group having the plurality of first data line pads that are adjacent to each other and a second group having the plurality of second data line pads that are adjacent to each other.

2. The display apparatus of claim 1, further comprising a scan driver circuit disposed between the plurality of main scan lines and the plurality of scan line pads, wherein the plurality of main scan lines and the plurality of scan line pads are electrically connected to the scan driver circuit.

3. The display apparatus of claim 2, wherein the plurality of main scan lines comprise:
a plurality of first main scan lines parallel to one another across the first display area; and
a plurality of second main scan lines parallel to one another across the second display area.

4. The display apparatus of claim 3, wherein the scan driver circuit comprises a first scan driver circuit electrically connected to the plurality of first main scan lines, and a second scan driver circuit electrically connected to the plurality of second main scan lines.

5. The display apparatus of claim 4, wherein the plurality of scan line pads comprise a plurality of first scan line pads electrically connected to the first scan driver circuit, and a plurality of second scan line pads electrically connected to the second scan driver circuit.

6. The display apparatus of claim 5, wherein the plurality of first scan line pads are disposed between the plurality of first data line pads and the plurality of second scan line pads, and the plurality of second scan line pads are disposed between the plurality of first scan line pads and the plurality of second data line pads.

7. The display apparatus of claim 1, wherein the display area does not have a pointed portion.

8. The display apparatus of claim 1, wherein the display area is circular or oval shaped.

9. A display apparatus comprising:
a substrate having a display area and a peripheral area surrounding the display area;
first data lines, second data lines, and main scan lines arranged in parallel to one another;
sub scan lines arranged in parallel to one another and respectively corresponding to the main scan lines, the sub scan lines disposed to cross the main scan lines;
first data line pads electrically connected to the first data lines;
second data line pads electrically connected to the second data lines; and
scan line pads electrically connected to the main scan lines,
wherein:
the substrate is divided into a first side and a second side with respect to a reference axis passing through a center of the display area;
the first data line pads, the scan line pads, and the second data line pads are located in the first side; and
a single group, which includes all of the plurality of scan line pads on the substrate that are adjacent to each other, is disposed in an area between a first group having the plurality of first data line pads that are adjacent to each other and a second group having the plurality of second data line pads that are adjacent to each other.

10. The display apparatus of claim 9, wherein the display area further comprises a first display area and a second display area.

11. The display apparatus of claim 9, wherein the first data lines, the second data lines, the main scan lines, and the sub scan lines are disposed across the display area.

12. The display apparatus of claim 9, further comprising a scan driver circuit disposed between the main scan lines and the scan line pads, the main scan lines and the scan line pads are electrically connected to the scan driver circuit.

13. The display apparatus of claim 12, wherein the main scan lines comprise first main scan lines in parallel to one another; and second main scan lines in parallel to one another.

14. The display apparatus of claim 13, wherein the scan driver circuit comprises a first scan driver circuit electrically connected to the first main scan lines, and a second scan driver circuit electrically connected to the second main scan lines.

15. The display apparatus of claim 14, wherein the plurality of scan line pads comprise first scan line pads electrically connected to the first scan driver circuit, and second scan line pads electrically connected to the second scan driver circuit.

16. The display apparatus of claim 15, wherein the first scan line pads are disposed between the first data line pads and the second scan line pads, and the second scan line pads are disposed between the first scan line pads and the second data line pads.

* * * * *